US011567121B2

(12) United States Patent
Fleming et al.

(10) Patent No.: US 11,567,121 B2
(45) Date of Patent: Jan. 31, 2023

(54) INTEGRATED CIRCUIT WITH EMBEDDED TESTING CIRCUITRY

(71) Applicant: Texas Instruments Incorporated, Dallas, TX (US)

(72) Inventors: George Earl Fleming, Rockwall, TX (US); Adrian Poh Siang Chan, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 116 days.

(21) Appl. No.: 16/836,820

(22) Filed: Mar. 31, 2020

(65) Prior Publication Data

US 2021/0302493 A1 Sep. 30, 2021

(51) Int. Cl.
*G01R 31/28* (2006.01)
(52) U.S. Cl.
CPC .................. *G01R 31/2884* (2013.01)
(58) Field of Classification Search
CPC ................ G01R 31/28; G01R 31/2884; G01R 31/3004; G01R 31/31715; G01R 31/31701; H01L 22/34
See application file for complete search history.

(56) References Cited

U.S. PATENT DOCUMENTS

| 5,138,257 | A | * | 8/1992 | Katsura | .......... | G01R 31/318505 |
| | | | | | | 324/537 |
| 5,648,973 | A | | 7/1997 | Mote, Jr. | | |
| 5,786,703 | A | | 7/1998 | Piirainen | | |
| 7,657,807 | B1 | | 2/2010 | Watkins | | |
| 2017/0160317 | A1 | * | 6/2017 | Naidu | .................. | G01R 19/165 |

FOREIGN PATENT DOCUMENTS

EP 0173945 A2 3/1986

OTHER PUBLICATIONS

PCT International Search Report dated Jun. 24, 2021.

* cited by examiner

*Primary Examiner* — Jermele M Hollington
*Assistant Examiner* — Suresh K Rajaputra
(74) *Attorney, Agent, or Firm* — Ronald O. Neerings; Frank D. Cimino

(57) ABSTRACT

An integrated circuit, comprising a plurality of pins, including a signal output pin. The integrated circuit also comprises a plurality of signal nodes. Each node in the plurality of signal nodes is operable to store a respective internal data signal. The integrated circuit also comprises a plurality of testing circuits. Each testing circuit in the plurality of testing circuits configured to sample a respective internal data state and in response to concurrently couple a unique output signal to a same pin in the plurality of pins, other than the signal output pin.

20 Claims, 4 Drawing Sheets

INTEGRATED CIRCUIT WITH EMBEDDED TESTING CIRCUITRY

CROSS-REFERENCE TO RELATED APPLICATION

Not applicable.

BACKGROUND

The example embodiments relate to integrated circuits (IC singular, ICs plural) and, more particularly, to ICs including embedded testing circuitry and the testing of such ICs.

Design for testing (DFT) refers to IC design aspects that provide testability to the IC once it is in production or manufactured form. Typical DFT circuitry can be enabled during testing and disabled when the IC is to operate in its nominal, non-testing environment. During testing, the DFT circuit(s) allow additional apparatus, such as automated test equipment (ATE), to provide input test signals to an IC in test mode, and to observe, capture, and analyze corresponding output signals that result from the input test signals. Both DFT and ATE testing are common in IC design and production, thereby increasing IC yield and reducing IC failure once ICs are released and implemented in intended device application(s).

DFT implementations can be used in ICs of various different pin counts, but can be more challenging for ICs with relatively fewer pins (e.g., six pins or less). Specifically, for a higher pin count IC, a design may have the flexibility to include one or more dedicated test pins, either for input or output signals. In contrast, for a lower pin count IC, the design will typically have strict limits on the number of pins, in which case one or more pins may be connected to provide different functions at different times. In such instances, however, the DFT implementation may require more complex internal structure, so as to support one type of signal communication to a pin (e.g., the IC output pin) during non-testing operation and a different type of signal communication to that same pin during testing.

Accordingly, example embodiments are provided in this document that may improve on certain of the above concepts, as further detailed below.

SUMMARY

An integrated circuit, comprising a plurality of pins, including a signal output pin. The integrated circuit also comprises a plurality of signal nodes. Each node in the plurality of signal nodes is operable to store a respective internal data signal. The integrated circuit also comprises a plurality of testing circuits. Each testing circuit in the plurality of testing circuits is configured to sample a respective internal data state and in response to concurrently couple a unique output signal to a same pin in the plurality of pins, other than the signal output pin.

Other aspects are also disclosed and claimed.

DETAILED DESCRIPTION

Figure 1:
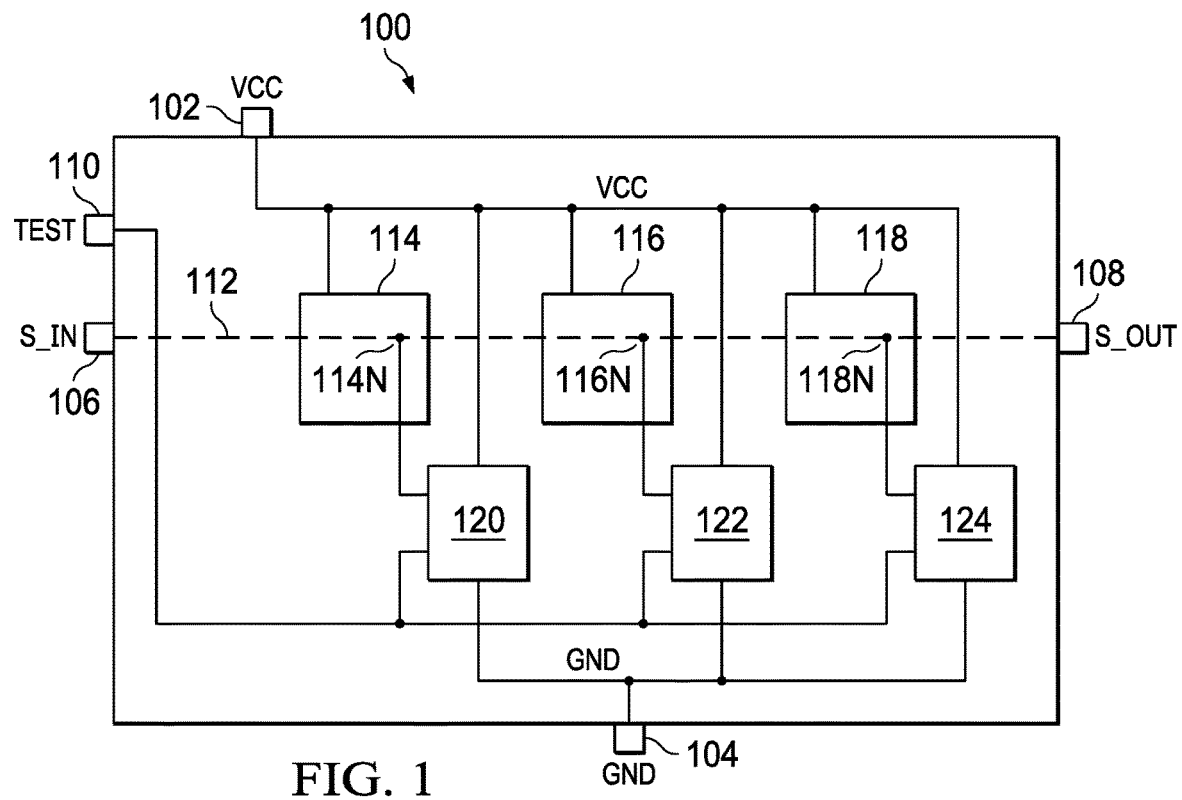
FIG. 1 illustrates a schematic of example embodiment IC 100 which includes embedded testing circuitry.

FIG. 1 illustrates a schematic of an example embodiment IC 100 which, as detailed below, includes DFT embedded testing circuitry. IC 100 includes four physical pins, sometimes referred to as pads, shown as pins 102, 104, 106, and 108, and a fifth pin 110 associated with a TEST condition, where pin 110 may be an additional physical pin, or a function that may be enabled as described later. Each physical pin is a conductor for providing a signal interface between IC 100 and an external connection. Example embodiment ICs may have any number of pins. Embodiments with fewer pins (e.g., six or less), however, may favorably facilitate testing IC 100 using a subset of its pins (which can be as few as one pin), where each pin in the pin subset provides some other respective function during non-testing operations. Such dual-pin use eliminates the need for a dedicated test pin(s), as may be implemented in ICs that have a larger number of pins. Pin 102 is for receiving a bias voltage VCC, and pin 104 is for connecting to a low reference voltage, such as ground (GND). Pin 106 is for receiving an input signal S_IN, and pin 108 is for providing an output signal S_OUT, where each of the input and output signals can be of various types, such as voltage, current, or data, depending on the functionality of IC 100. Further, for some ICs, a pin can have a nominal function in one mode, but a different function in another mode. So, for sake of example and illustration, in this document the nominal function for pin 106 is as input pin and the nominal function for pin 108 is as output pin, but in other embodiments one or both pins may provide an alternative function in a mode other than nominal operation. In general, a signal path 112 exists between S_IN pin 106 and S_OUT pin 108. Signal path 112 is illustrated as a dashed line, as it is not intended to be a same node throughout, but represents a general path through blocks that may be connected to different devices and other signal paths. Pin 110, as introduced above, represents either a physical pin or functional operation, where in either case an associated TEST signal is asserted. For example, if pin 110 is a physical dedicated test pin, it can receive an asserted TEST signal. As another example, pin 110 may represent a physical pin that has one function during not-testing operations and a different function to enable testing during testing operations. Indeed, pin 110 could be instantiated by pin 106 to receive S_IN during non-testing, while during testing either a signal at pin 110, or a signal to pin 110 either alone or in combination with signaling to one or more other pins, causes circuitry internal to IC 100 to assert the TEST signal, thereby placing IC 100 in a condition for testing (e.g., a test mode). Either of these options enables testing of IC 100, as further detailed below.

IC 100 includes a number N of functional blocks, which by way of example is shown as N=3 functional blocks 114, 116, and 118. N can be selected from a wide numeric range, based on IC implementation, functionality, and testing requirements. By way of example, signal path 112 is shown passing through each of functional blocks 114-118, and each such block includes a respective internal data state that is desirable for testing. Each of functional blocks 114-118 is also biased between VCC and ground. Further, each of functional blocks 114-118 may provide a same or different function, where collectively these blocks (and potentially others, not shown) provide an overall function of IC 100. Example embodiments include myriad types of ICs, so neither the layout nor the number N of functional blocks 114-118 is intended to be limiting. Instead, each functional block is intended to illustrate circuitry and/or connectivity in IC 100, where a node of the respective functional block provides a data state during IC operation, and as introduced above that data state is desirable for testing.

Figure 2:
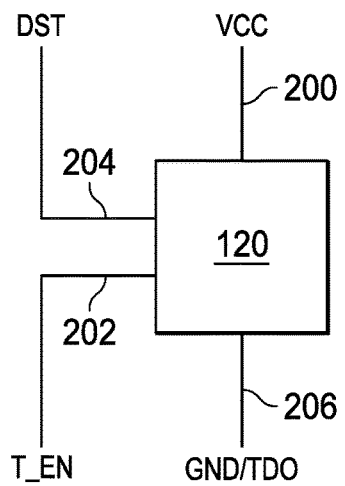
FIG. 2 illustrates a block diagram of a testing circuit that may be used in each of the FIG. 1 testing circuits 120, 122, and 124.

Each of functional blocks 114, 116, and 118 includes a respective node 114N, 116N, and 118N connected to an input of a respective testing circuit 120, 122, and 124. Each of testing circuits 120, 122, and 124 has a same schematic configuration, although as detailed later, device parameters (e.g., dimensions) may vary per testing circuit. For sake of simplifying the illustration, FIG. 2 illustrates a block diagram of testing circuit 120, with its input/output (I/O) further labeled, and to be understood as applicable in FIG. 1 as to all testing circuits 120, 122, and 124. Returning to FIG. 1, with the additional illustration and references of FIG. 2, a first testing circuit external connection 200 in FIG. 2 is for receiving VCC, as shown in FIG. 1 from VCC pin 102. A second testing circuit external connection 202 in FIG. 2 is a test enable (T_EN) input, shown in FIG. 1 connected to TEST pin 110. A third testing circuit external connection 204 in FIG. 2 is for receiving a data state (DST) at an internal node, shown in FIG. 1 as respective connections to nodes 114N, 116N, and 118N. A fourth testing circuit external connection 206 in FIG. 2 provides a test data output TDO, shown in FIG. 1 connected to GND pin 104. As detailed below, when IC 100 testing is enabled (by asserting TEST and correspondingly T_EN), the test data output TDO at GND pin 104 provides a modulated signal output, with its magnitude depending on the data inputs to, and corresponding outputs of, testing circuits 120, 122, and 124. Particularly in an example embodiment, each of testing circuits 120, 122, and 124 outputs an analog current, thereby adding cumulatively to the mutual electrical node indicated by GND pin 104. Accordingly, TDO effectively includes the total current from all three testing circuits 120, 122, and 124. Note that TDO also may include additional current flow from other devices that remain connected to GND pin 104 during both non-testing and testing modes; this additional current flow can be readily determined and subtracted as an offset from measures of TDO during testing operations.

Figure 3:
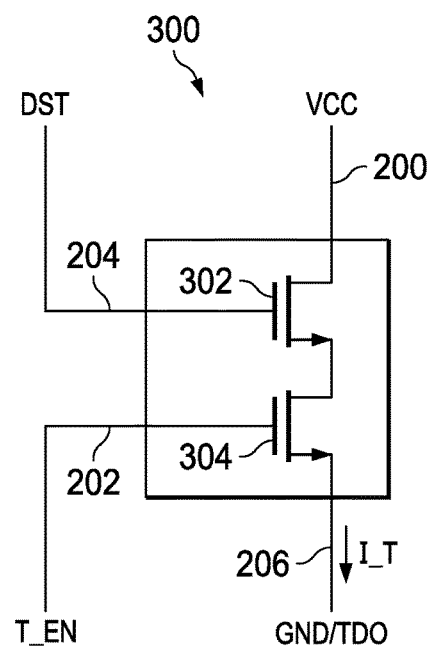
FIG. 3 illustrates a schematic of one example embodiment of a two transistor testing circuit, as may be used in any of the FIG. 1 testing circuits 120, 122, and 124.

FIG. 3 illustrates a schematic of one example embodiment of a testing circuit 300, as used in all of testing circuits 120, 122, and 124 of FIG. 1. Testing circuit 300 includes two transistors, which in the illustrated example are NMOS transistors 302 and 304. The nominal on-resistance, RDSON, of each transistor during times when the transistor is enabled, is described by the following Equation 1:

$$RDSON = W/L \times C \qquad \text{Equation 1}$$

where, W is the transistor structural width, L is the transistor structural length, and C is a constant factor, thereby making RDSON proportional to W and L (and C, which for purpose herein can be disregarded, as a constant). In an example embodiment, RDSON of transistor 302 equals RDSON of transistor 304, which is achieved by constructing each transistor to have the same width W, and each transistor to have the same length L (and having the same constant C). Alternatively, mathematically equivalent RDSON values per transistor could be achieved by having different lengths and widths, as between each transistor, so long as the W/L ratio per transistor were equal to one another. As a practical implementation matter of constructing transistors, however, a desirable approach is a same W and same L as described above. In any event, the total series resistance of RDSON across both transistors should be known, for purposes of evaluating the test data output TDO, as detailed later.

The connectivity of transistors 302 and 304 is now described. A drain of NMOS transistor 302 is connected to external connection 200, which is connected for receiving VCC as shown in the example of FIG. 2 at connection 200, and as also shown for each of testing circuits 120, 122, and 124 in FIG. 1. A gate of NMOS transistor 302 is connected to external connection 204, which recall is for receiving data state DST. A source of NMOS transistor 302 is connected to a drain of NMOS transistor 304. A gate of NMOS transistor 304 is connected to external connection 202, which recall is for receiving test enable T_EN. A source of NMOS transistor 304 is connected to connection 206, which recall from FIG. 1 provides test data output TDO and also is connected to GND pin 104 of IC 100.

The operation of testing circuit 300 is now explained, first with respect to any singular one of the N=3 testing circuits 120, 122, and 124 in IC 100. Alternatively, however, a later embodiment provides additional functionality using a cumulative effect of one or more of those testing circuits concurrently providing a cumulative test data output TDO. A single testing circuit 300 essentially provides a 2-input logic AND operation that gates current output in response to the inputs DST and T_EN. The AND functionality also depends on the asserted state of the input (e.g., active high or low) and the conductivity type of transistors 300 and 302. For example, when transistors 302 and 304 are NMOS, and when both inputs DST and T_EN are active high signals, then when both DST and T_EN are active, a conductive path occurs between connection 200 and connection 206, and a total current I_T flows along that path. The total current I_T of circuit 300 can be estimated according to the following Equation 2:

$$I\_T = VCC/RDSON \qquad \text{Equation 2}$$

where, RDSON is the total RDSON of both transistors 302 and 304.

Equation 2 confirms that total current I_T is based on VCC and the combined series resistance of both transistors 302 and 304. Accordingly and as detailed later, during testing T_EN is asserted via pin 110 (physically or functionally) in FIG. 1, and when a sampled data state DST is concurrently asserted, then the total current I_T provides a measurable signal as TDO, which is sampled at GND pin 104. In other words, when the current magnitude at GND pin 104 is above a negligible level, such current level indicates that data DST is asserted, which if active high means the sampled data state is at a logic high level, thereby confirming the active high data state of DST. Similarly, therefore, when testing is enabled and data DST is inactive (logic low), the total current I_T is zero or negligible, thereby confirming the inactive high data state of DST. From the above, the magnitude of TDO indicates the state of DST during testing, at least for a single respective testing circuit 120, 122, or 124.

The preceding illustrates testing a data state DST for a single testing circuit 300 as any of testing circuits 120, 122, or 124, but in an alternative example embodiment a respective data state DST for each separate testing circuit 120, 122, or 124 can be concurrently tested. Such separate testing is achieved by using the same electrical schematic of testing circuit 300 for each of testing circuits 120, 122, and 124, but device (e.g., transistor) parameters in each testing circuit are modified, so that each circuit provides a measurably different output. For example, transistor RDSON in each testing circuit 120, 122, and 124 is altered to have a different value from each of the other testing circuits. RDSON can be adjusted by changing the transistor width and/or length in each testing circuit. In one example, therefore, each respective RDSON value is adjusted according to differing power of 2, such as shown in the following Equation 3:

$$RDSON(\text{of circuit}120)=2*RDSON(\text{of circuit}122)=4*RDSON(\text{of circuit}124) \quad \text{Equation 3}$$

The differing RDSON values of Equation 3 enable respective differing total current magnitudes through each of testing circuits 120, 122, and 124, given Equation 2. For example, since RDSON (circuit 120) is two times that of RDSON (circuit 122), and since both of those resistances have the same VCC potential across them, then the total current magnitude though circuit 120, when enabled, will be one-half that of the total current magnitude through circuit 122, when enabled. As another example, since RDSON (circuit 120) is four times that of RDSON (circuit 124), and since both of those resistances have the same VCC potential across them, then the total current magnitude though circuit 120, when enabled, will be one-fourth that of the total current magnitude though circuit 124, when enabled.

Figure 4:
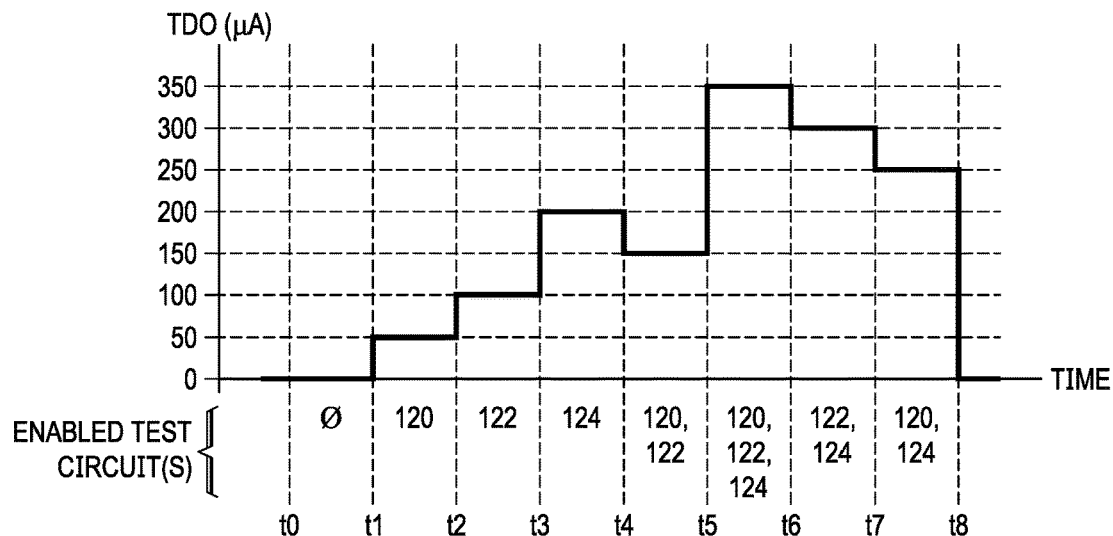
FIG. 4 illustrates an example signal diagram for concurrently testing the three FIG. 1 testing circuits 120, 122, and 124.

With the resistance (RDSON) examples of Equation 3, FIG. 4 illustrates an example signal diagram for concurrently testing the three IC 100 testing circuits 120, 122, and 124. In FIG. 4, the horizontal axis illustrates time and the vertical axis illustrates TDO. For all times between times t0 and t8, T_EN is asserted, thereby enabling the respective transistor in each of circuits 120, 122, and 124, to which T_EN is gate connected. Also for the illustrated example, assume that VCC=5 V and that RDSON=100 kOhms. Accordingly, given the relative values of RDSON for testing circuits 120, 122, and 124 as shown in Equation 3, and the total current from Equation 2, then when only one of those circuits is enabled at a time, the total current I_T, which reaches the data output TDO, is as shown in the following Table 1:

TABLE 1

| Testing circuit | I_T |
|---|---|
| 120 | 50 μA |
| 122 | 100 μA |
| 124 | 200 μA |

FIG. 4, however, illustrates some instances where one or more of the testing circuits are concurrently enabled, representing different data possibilities, as are detailed below.

In the time period between time t0 and t1, TDO is 0 (or some negligible value), thereby indicating that none of the three testing circuits 120, 122, and 124, is conducting a non-negligible current. As a result, test sampling and measuring the lack of current at TDO confirms that for each of the three testing circuits 120, 122, and 124, the respective transistor gate-connected to DST is receiving a non-enabling signal, so none of the testing circuits is enabled (as shown by the null symbol in FIG. 4 for the time period). Thus, between t0 and t1, the testing readily translates the lack of current to indicate that the following Table 2 data values are present:

TABLE 2

| Testing circuit | DST of testing circuit |
|---|---|
| 120 | 0 |
| 122 | 0 |
| 124 | 0 |

In the time period between time t1 and t2, TDO (minus any offset from other devices contributing current to TDO in both non-testing and testing mode) is 50 μA. Recall that TDO is effectively the total current I_T from all three testing circuits 120, 122, and 124, and the respective values of RDSON and I_T cause each testing circuit to conduct a different current amount when enabled. Accordingly, in the present time period (t1 to t2), where TDO=50 μA, that TDO value is test sampled, and it can be translated based on the values in Table 1, namely, here a TDO value of 50 μA translates that during this time period, testing circuit 120 is enabled at it is the one that conducts 50 μA, while testing circuits 122 and 124 are not enabled. Thus, between t1 and t2, the following Table 3 data values are present:

TABLE 3

| Testing circuit | DST of testing circuit |
|---|---|
| 120 | 1 |
| 122 | 0 |
| 124 | 0 |

The next two successive time periods in FIG. 4 likewise illustrate instances of only a single testing circuit enabled at a time, that is: (i) between time t2 and t3, a value of TDO=100 μA is an indication that during this time period, testing circuit 122 is enabled as it is the one that conducts 100 μA, while testing circuits 120 and 124 are not enabled; and (ii) between time t3 and t4, a value of TDO=200 μA is an indication that during this time period, testing circuit 124 is enabled as it is the one that conducts 200 μA, while testing circuits 120 and 122 are not enabled.

In the time period between time t4 and t5, TDO is 150 μA. Accordingly, the TDO=150 μA, as also may be appreciated from Table 1, is test sampled and translated to an indication that not just one testing circuit is enabled in this period. Instead, because of the power of two ratios between RDSON of each testing circuit, then each possible combination of the Table 1 current values of two or three conduction testing circuits will result in a unique total output. For example, TDO=150 µA uniquely indicates that during this time period, testing circuits 120 and 122 are enabled, while testing circuit 124 is not. Thus, between t4 and t5, the following Table 4 data values are present:

TABLE 4

| Testing circuit | DST of testing circuit |
|---|---|
| 120 | 1 |
| 122 | 1 |
| 124 | 0 |

The next three successive time periods in FIG. 4 likewise illustrate instances of multiple testing circuits enabled at a time, that is: (i) between time t5 and t6, a value of TDO=350 µA is an indication that during this time period, all testing circuits 122, 124, and 126 are enabled; (ii) between time t6 and t7, a value of TDO=300 µA is an indication that during this time period, testing circuits 122 and 124 are enabled, while testing circuit 120 is not; and (iii) between time t7 and t8, a value of TDO=250 µA is an indication that during this time period, testing circuits 120 and 124 are enabled, while testing circuit 122 is not.

Figure 5A:
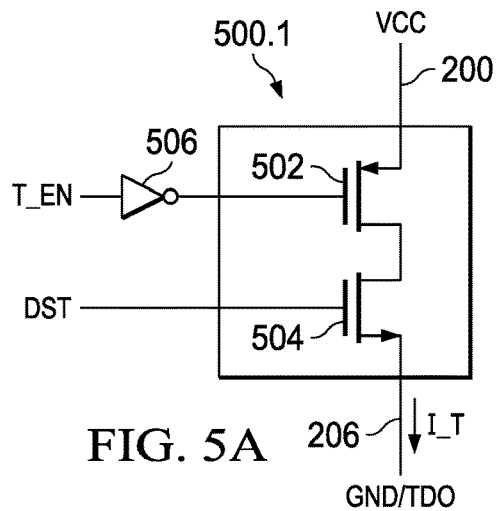
FIG. 5A illustrates a testing circuit schematic with an NMOS transistor 504 providing an active high data state response.
Figure 5B:
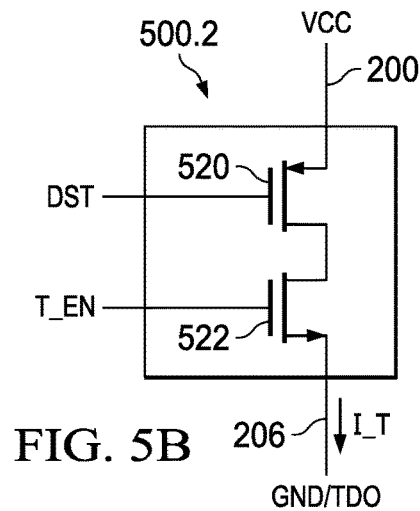
FIG. 5B illustrates a testing circuit schematic enabled by an active high test enable signal T_EN and a PMOS transistor 520 providing an active low data state response.
Figure 5C:
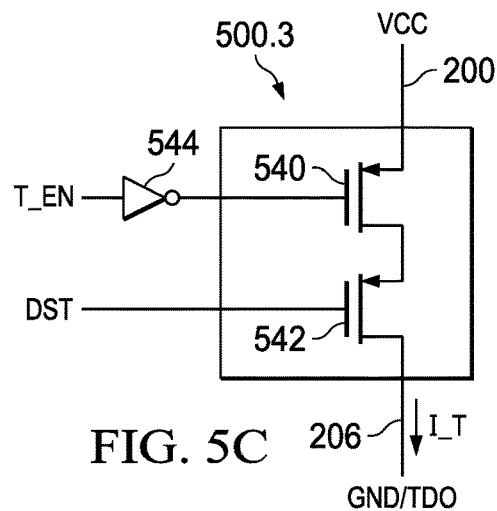
FIG. 5C illustrates an alternative testing circuit schematic enabled by an active high test enable signal T_EN and a PMOS transistor 542 providing an active low data state response.

FIGS. 5A, 5B, and 5C illustrate respective schematic examples of a testing circuit 500.1, 500.2, and 500.3, any of which may be used in all of testing circuits 120, 122, or 124. Accordingly, circuit 500.1, 500.2, or 500.3 may replace circuit 300 of FIG. 3, although some connections are similar and certain reference labels and signals are carried forward from FIG. 3 into FIGS. 5A, 5B, and 5C. Also as introduction, the FIGS. 5A, 5B, and 5C schematics are readily ascertainable as alternative configurations, compared to FIG. 3, in which one or both of a transistor conductivity type (NMOS or PMOS) is changed, as may be signal inversion for T_EN, where appropriate. With the changes, a conductive path is again realized through both transistors, when T_EN is asserted and the monitored data state DST is either active high or active low, depending on transistor conductivity type as detailed below.

In FIG. 5A, testing circuit 500.1 includes a PMOS transistor 502 with a source connected to VCC and a drain connected to a drain of an NMOS transistor 504, which has its source connected to GND/TDO and its gate connected to DST. The gate of PMOS transistor 502 is connected to an output of an inverter 504, which has an input connected to T_EN. When T_EN is asserted high, inverter 504 provides a low signal to PMOS transistor 502 causing it to conduct, while NMOS transistor 504 conducts only when DST is asserted high. Accordingly, testing circuit 500.1 functions to output non-negligible current in response to a local AND of the active high inputs of T_EN and DST.

In FIG. 5B, testing circuit 500.2 includes a PMOS transistor 520 with a gate connected to DST, a source connected to VCC, and a drain connected to a drain of an NMOS transistor 522. The source of NMOS transistor 522 is connected to GND/TDO, and the gate of NMOS transistor 522 is connected to T_EN. When T_EN is asserted high, that provides the high signal to the gate of NMOS transistor 522 causing it to conduct, while PMOS transistor 520 conducts only when DST is asserted low. Accordingly, testing circuit 500.2 functions to output non-negligible current in response to a logic AND of the active high input of T_EN and the active low signal of DST.

In FIG. 5C, testing circuit 500.3 includes a PMOS transistor 540 with a source connected to VCC and a drain connected to a drain of a PMOS transistor 542, which has its source connected to GND/TDO and its gate connected to DST. The gate of PMOS transistor 540 is connected to an output of an inverter 544, which has an input connected to T_EN. When T_EN is asserted high, inverter 544 provides a low signal to the gate of PMOS transistor 540 causing it to conduct, while PMOS transistor 542 conducts only when DST is asserted low. Accordingly, testing circuit 500.1 functions to output non-negligible current in response to a logic AND of the active high input of T_EN and the active low signal of DST.

Figure 6:
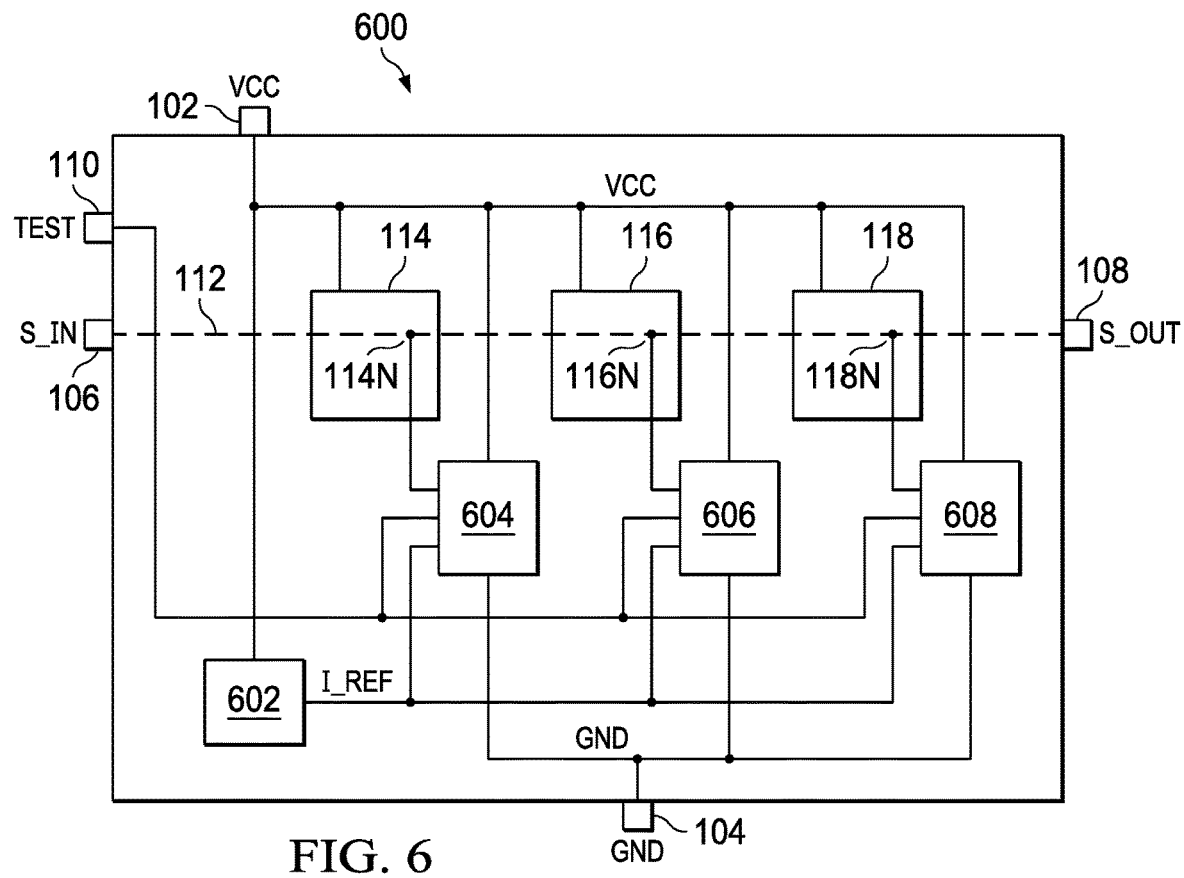
FIG. 6 illustrates a schematic of an alternative example embodiment IC 600 which includes embedded testing circuitry.

FIG. 6 illustrates a schematic of an alternative example embodiment IC 600. IC 600 shares various commonality with the IC 100 of FIG. 1, so reference numbers for common items are carried forward from FIG. 1 to FIG. 6, and the reader is assumed familiar with the earlier discussion. IC 600 further includes a current reference circuit 602, which is connected to VCC and outputs a fixed current reference, I_REF. Current reference circuit 602 may be constructed in various forms, such as by a bandgap current reference. A bandgap current reference is often used to generate a stable and relatively fixed voltage or current, which is achievable due to the intrinsic bandgap voltage of the IC substrate material, such as silicon. The bandgap output current I_REF (or voltage) remains stable, despite changes in input voltage and temperature. Further in IC 600, current I_REF is connected as an input to each of testing circuits 604, 606, and 608, which are further detailed below.

Figure 7:
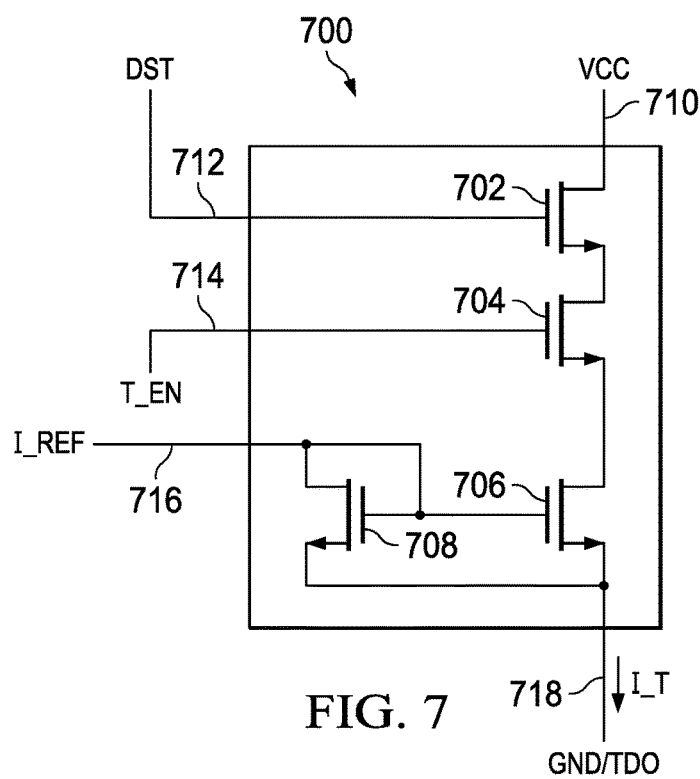
FIG. 7 illustrates a schematic of one example embodiment of a three transistor testing circuit (in combination with a mirroring transistor), as may be used in any of the FIG. 6 testing circuits 604, 606, or 608.

FIG. 7 illustrates a schematic of an example embodiment of a testing circuit 700, as may be used in all of testing circuits 604, 606, and 608 of FIG. 6. Testing circuit 700 includes three transistors having a shared source/drain path, which in the illustrated example are NMOS transistors 702, 704, and 706. Testing circuit 700 also includes an additional NMOS transistor 708. The nominal on-resistance, RDSON, of all four transistors is described by the earlier-detailed Equation 1, and again the total series resistance of RDSON across all transistors should be known, for purposes of evaluating the test data output TDO.

The connectivity of testing circuit 700 is now further described and also will be understood in part from earlier embodiments. A drain of NMOS transistor 702 is connected to an external connection 710, which is for receiving VCC. A gate of NMOS transistor 702 is connected to an external connection 712, which is for receiving data state DST. A source of NMOS transistor 702 is connected to a drain of NMOS transistor 704. A gate of NMOS transistor 704 is connected to an external connection 714, which is for receiving test enable T_EN. A source of NMOS transistor 704 is connected to a drain of NMOS transistor 706. A gate of NMOS transistor 706 is connected to an external connection 716, which is for receiving bandgap output current I_REF. The source of NMOS transistor 706 is connected to a connection 718, which provides total current I_T as the test data output TDO and is also connected to GND pin 104 of IC 600. I_REF is also connected to the drain and gate of NMOS transistor 708, and the source of NMOS transistor 708 is also connected to connection 718.

The operation of testing circuit 700 is now explained. Testing circuit 700 provides a 2-input logic AND operation that gates total current I_T output in response to the inputs DST and T_EN, coupled with the added configuration of current mirroring provided by NMOS transistors 706 and 708. Specifically, given the asserted state of the input (e.g., active high or low) and the NMOS conductivity type of transistors 702 and 704, when both DST and T_EN are active high, then transistors 702 and 704 conduct, providing a positive voltage to the drain of NMOS transistor 706. In response, NMOS transistors 706 and 708 form a current mirror of I_REF, with the total current I_T sourced by both transistors 706 and 708, further responsive to the magnitude of I_REF and further controlled by the W/L ratio between those two transistors. Accordingly, if the available I_REF (e.g., based on bandgap limitations) is limited, that limit necessarily also limits the total current I_T. Some testing equipment, however, is capable of sensing a reduced amount of output current as between different levels, thereby detecting the different possible data that could occur for various combinations comparable to Table 1, but with each individual output potentially at lower values than 50 µA.

The preceding operation of testing circuit 700 applies individually and collectively to the FIG. 6 testing circuits 604, 606, and 608. Particularly, T_EN is asserted via pin 110 in FIG. 6 during testing, and when a sampled data state DST is concurrently asserted, then the output total I_T provides a measurable signal as TDO, which is sampled at pin 104. When the current value at pin 104 is above a negligible level, such current level indicates that data DST is asserted, which if active high means the sampled data state is at a logic high level, thereby confirming the active high data state of DST. Similarly, therefore, when testing is enabled and data DST is inactive (logic low), no non-negligible current I_T is provided, thereby confirming the inactive high data state of DST. Accordingly, the magnitude of TDO indicates the state of DST during testing of each respective testing circuit 604, 606, or 608. Additionally, the preceding has demonstrated that RDSON may be adjusted for selected transistors (e.g., either of 706 and 708, or further either or both of 702 and 704), so that each instance of testing circuit 700, used for testing circuits 604, 606, and 608, provides a different output current magnitude when enabled. As shown earlier in connection with Table 1, differing current magnitudes when enabled provide distinguishable output signals for detecting the respective data state DST per each testing circuit.

Figure 8:
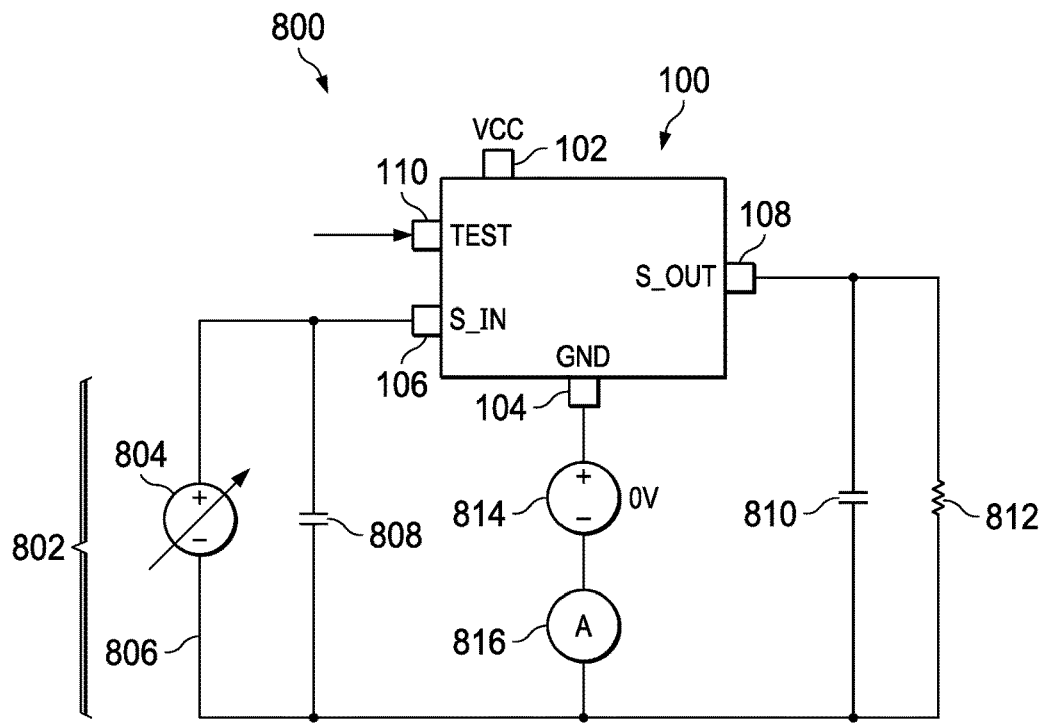
FIG. 8 illustrates a schematic of a testing environment for testing the FIG. 1 IC 100 (or readily modified to test the FIG. 6 IC 600).

FIG. 8 illustrates a schematic of an example testing environment 800. Environment 800 is for testing, and therefore also illustrates, IC 100 of FIG. 1 (or readily modified to also test IC 600 of FIG. 6). Beyond IC 100, testing environment 800 can be embodied in various forms to accomplish the other elements in FIG. 8, where by way of example part or all of those elements may be implemented in various commercially-available or developed general-purpose automated test equipment (ATE) 802. For this reason, in FIG. 8 the reference of ATE 802 is generally to various components outside of IC 100, again to contemplate that some or all can be part of ATE 802. ATE 802 is either programmable, or controlled by a separate programmable device (not shown), to sequence through a test program that causes signals to be applied to IC 100. Accordingly, ATE 802 is shown to include a variable voltage (or other signal) source 804, although typical ATE equipment includes considerable signal generation capability beyond just a variable voltage source. The positive side of voltage source 804 is connected to provide a signal (e.g., voltage) to S_IN pin 106, and the negative side of voltage source 804 is provides an ATE ground 806. An input capacitor 808 is connected between S_IN pin 106 and ATE ground 806. A test load is included, shown for example to include an output capacitor 810 and output resistor 812, connected between S_OUT pin 108 and ATE ground 806. Input and output capacitors 808 and 810 are an example of a testing application, but could be optional for other instances and are not limiting to implementation and testing of IC 100. The positive terminal of a 0 volt supply 814 is connected to GND pin 104, and the negative terminal of 0 volt supply 814 is connected to a first terminal of an ammeter 816. A second terminal of ammeter 816 is connected to ATE ground 806.

Figure 9:
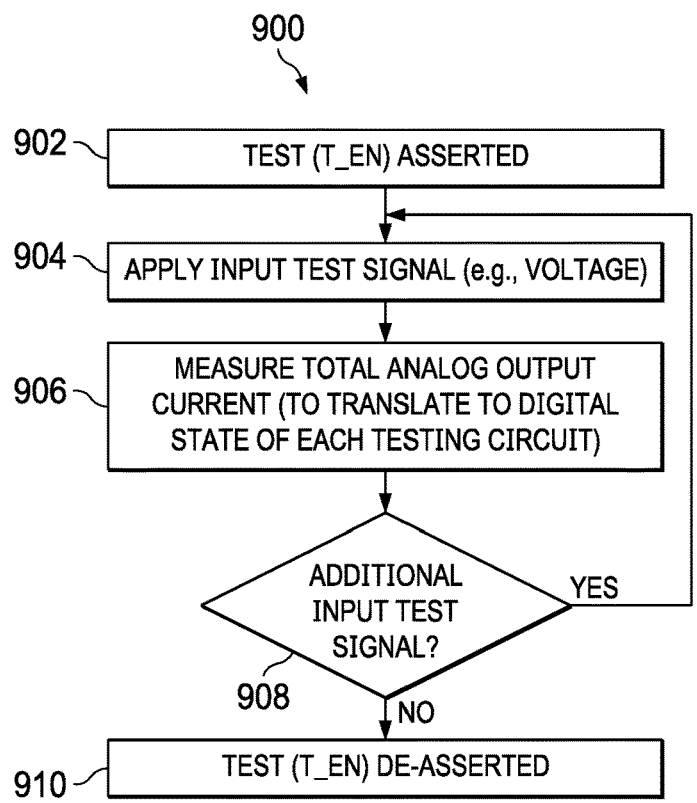
FIG. 9 illustrates a flowchart of an example embodiment method 900 of the FIG. 8 testing environment.

FIG. 9 illustrates a flowchart of an example embodiment method 900, as may be performed by an ATE test program for testing environment 800 of FIG. 8. Method 900 is an example, where teachings of this document also facilitate the addition, deletion, or re-ordering of one or more steps in method 900. Further, a flowchart is used by way of example as to step sequencing, but other forms (e.g., state diagram) also may be used to demonstrate the flow, from which adequate ATE programming may be provided.

Method 900 starts with a step 902. In step 902, testing of IC 100 commences, for example by an assertion of the TEST (test enable) signal. As described earlier, TEST may be asserted to a dedicated TEST pin 110, which is illustrated generally by an arrow to TEST pin 110, as may be accomplished by a signal from ATE 802. Alternatively, a signal may be asserted to one or more pins, which can include a pin that is used for something other than testing during non-test operations, where the result is asserting T_EN. Next, method 900 continues to step 904.

In step 904, variable voltage source 804 outputs a test input signal (e.g., test voltage) level to S_IN pin 106, and various circuitry internal to IC 100 responds to the test input signal. For example returning to FIG. 1, the test input signal has a propagating affect along signal path 112, through each of functional blocks 114, 116, and 118, and affects the data states in those blocks. Meanwhile, the asserted TEST (or T_EN) signal enables each transistor to which it is gate-connected, in each of testing circuits 120, 122, and 124. Accordingly, and further due to the forced 0V voltage at the external connection 206 (see, FIG. 2) of each of those circuits, then each circuit is enabled to output a respective current magnitude to GND pin 104, with that magnitude determined based on transistor RDSON values and the data state DST in each testing circuit. Next, method 900 continues to step 906.

In step 906, ammeter 816 measures the total amount of current provided by GND pin 104. The total current amount can be stored for later evaluation, or it can be essentially translated (e.g., analog to digital conversion) during step 906, so as to inform of the data state DST in each testing circuit. Particularly, and as described in more detail earlier in connection with Table 1, given the mutual connection of all testing circuit outputs to a single node and in view of the total number of testing circuits, then the total output current may be equal to that of zero, one, or some combination of enabled testing circuits. The total current, therefore, represents an analog measure of the respective data state DST of all testing circuits. Next, method 900 continues to step 908.

Step 908 is a condition check to determine whether there is an additional input test signal (e.g., voltage) to be tested. For example, if IC 100 is an analog-to-digital voltage converter, then testing of such a device may include a sweep across a number of different input analog voltage levels, each time checking the IC output (e.g., S_OUT 106) to determine if an appropriate digital voltage is achieved. In the same regard, the example embodiment allows internal states of such a device to be tested, for each of the same (or different) input voltages used to test the digital output. As another example, if IC 100 is a voltage regulator, then testing of such a device also may include a sweep across a number of different input analog voltage levels, each time checking the IC output to determine if the IC properly regulates to the desired (e.g., constant) output voltage. Again, therefore, for each test input signal, testing per the example embodiment can further include testing of internal data state DST values of IC 100. For these and other examples, therefore, there may be a number of different input test signals tested, and step 908 therefore can store a condition, such as the number of desired test input signals, or some other control. Accordingly, in each instance when further testing at a different input signal is desired, step 908 returns control of method 900 to step 904, where a new input test signal is applied, followed again by an instance of steps 906 and 908. In contrast, when all of the different input test signal levels have been tested, step 908 directs control of method 900 to step 910, where the TEST signal is de-asserted. Accordingly, following step 910, IC 100 can be used for normal (non-testing) operation and functionality.

From the above, one skilled in the art should appreciate that example embodiments include ICs including DFT embedded production testing circuitry and the testing of such ICs. For example, apparatus and methodology embodiments are illustrated for testing an IC (e.g., IC 100 or IC 600) having multiple pins. In an example embodiment, testing of the IC is achieved by sampling the signal at one of the IC pins, other than its nominal signal output pin. In the example embodiments, such testing samples a signal (e.g., current) from the IC GND pin. Use of the GND pin in this manner, for an example embodiment, may be preferred as opposed to another pin, as the GND signal (and VCC) already will be distributed by respective signal paths to all functional blocks in an IC design, by the nature of each block requiring a biasing differential. As a result, there is minimal additional layout consideration of adding testing circuits between each desired functional block and the already-planned GND (and VCC) signal paths. In any event, the sampled signal at the desired pin (e.g., GND) is responsive to a number (e.g., one or more) of testing circuits of the IC, where each testing circuit outputs a signal based on a respective data state of the IC (e.g., at a node within the IC). Further, each testing circuit may include a unique parameter (e.g., RDSON) so that the respective testing circuit output signal is distinguishable from any other concurrently operated testing circuit. Accordingly, a plural number of testing circuits can output to a single mutual node, without the need for additional switching circuitry to that node, and that node can be sampled and the multiple data contributions can be discerned from its signal. Further, different example testing circuit configurations have been shown, for instance one responsive to an internal bandgap reference signal and another responsive to a testing circuit power supply (e.g., VCC). The distinguishable respective testing circuit outputs also may be combined, for example where testing signal outputs a current that is connected to a same node. Accordingly, example embodiment testing can concurrently test multiple different data states (or data state nodes) of the IC, where the combined magnitude of all IC testing circuits provides a signal from which the respective data state of each testing circuit is discernable. The example embodiments provide additional benefits. For example, testing may be achieved using readily-available commercial ATE IC testing equipment, with DUT output sampling at various levels of output signal (e.g., μA to mA). As another example, ICs can implement the present teachings into a package with relatively low or larger pin counts. As another example, structures can be added in parallel or in series for redundancy. As still another example, the number of data states monitored/tested can vary. These and others will be appreciated or ascertainable by one skilled in the art, in view of the teachings of this document. Accordingly, additional modifications are possible in the described embodiments, and other embodiments are possible, within the scope of the following claims.

What is claimed is:

1. An integrated circuit, comprising:
   a plurality of pins, including a signal output pin;
   a plurality of signal nodes, each node in the plurality of signal nodes operable to store a respective internal data signal; and
   a plurality of testing circuits, each testing circuit in the plurality of testing circuits configured to sample a respective internal data state and in response to concurrently couple a unique output signal to a same pin in the plurality of pins, other than the signal output pin.

2. The integrated circuit of claim 1, wherein the unique output signal of each testing circuit is provided in response to a parameter difference between each testing circuit in the plurality of testing circuits.

3. The integrated circuit of claim 1, wherein the unique output signal of each testing circuit is provided in response to a resistance difference between each testing circuit in the plurality of testing circuits.

4. The integrated circuit of claim 1, wherein the unique output signal of each testing circuit is provided in response to a structural difference between each testing circuit in the plurality of testing circuits.

5. The integrated circuit of claim 1, wherein the unique output signal of each testing circuit is provided in response to one of either a transistor width or transistor length difference between each testing circuit in the plurality of testing circuits.

6. The integrated circuit of claim 1, wherein the same pin comprises a ground pin of the integrated circuit that is used as a test data output.

7. The integrated circuit of claim 1, wherein the unique output signal comprises a current.

8. The integrated circuit of claim 1:
   wherein the unique output signal comprises a current; and
   wherein the current as a unique output signal from each testing circuit is a power of two different from the current as a unique output signal from each other testing circuit in the plurality of testing circuits.

9. The integrated circuit of claim 1, wherein each testing circuit in the plurality of testing circuits comprises:
   a first transistor having a gate coupled to receive a test enabling signal;
   a second transistor having a gate coupled to receive the internal data signal from a respective signal node in the plurality of signal nodes; and
   an output node for outputting a respective unique output signal responsive to a state of the test enabling signal and a state of the internal data signal from a respective signal node in the plurality of nodes.

10. The integrated circuit of claim 9, wherein each of the first transistor and the second transistor comprises an NMOS transistor.

11. The integrated circuit of claim 9:
    wherein the first transistor comprises an NMOS transistor;
    wherein the second transistor comprises a PMOS transistor; and
    wherein the respective internal data signal is an active low signal.

12. The integrated circuit of claim 1, wherein each testing circuit in the plurality of testing circuits comprises:
   a first transistor having a gate coupled to receive a test enabling signal;
   a second transistor having a gate coupled to receive the internal data signal from a respective signal node in the plurality of signal nodes;
   a third transistor coupled to mirror a current source; and
   an output node for outputting a respective unique output signal responsive to a state of the test enabling signal, a state of the internal data signal from a respective signal node in the plurality of signal nodes, and the current source.

13. A testing system, comprising:
   an integrated circuit, comprising:
      a plurality of pins, including a signal output pin and a signal input pin;
      a plurality of signal nodes, each node in the plurality of signal nodes operable to store a respective internal data signal;
      a plurality of testing circuits, each testing circuit in the plurality of testing circuits configured to sample a respective internal data state and in response to concurrently couple a unique output signal to a same pin in the plurality of pins, other than the signal output pin; circuitry for applying a voltage to the signal input pin; and
   circuitry for determining the respective internal data state of each testing circuit in response to an output at the same pin.

14. The testing system of claim 13 and further comprising circuitry for sampling a total current at the same pin.

15. A method of testing internal data states of an integrated circuit, comprising:
   enabling a test mode for the integrated circuit;
   during the test mode, applying an input signal to the integrated circuit, the integrated circuit including a signal output pin;
   during the test mode, measuring an output signal at a pin of the integrated circuit, other than at the signal output pin; and
   translating the output signal to a plurality of internal data states of the integrated circuit.

16. The method of claim 15 wherein the measuring step comprises measuring an output signal at a ground pin of the integrated circuit that is used as a test data output.

17. The method of claim 15 wherein the measuring step comprises measuring a current output signal at a pin of the integrated circuit.

18. The method of claim 15 wherein the measuring step comprises measuring a current output signal at a ground pin of the integrated circuit that is used as a test data output.

19. The method of claim 15:
   wherein each internal data state in the plurality of internal data states corresponds to a respective testing circuit in a plurality of testing circuits; and
   wherein each testing circuit is operable to output a respective output signal unique from an output signal from each other testing circuit in the plurality of testing circuits.

20. The method of claim 15:
   wherein each internal data state in the plurality of internal data states corresponds to a respective testing circuit in a plurality of testing circuits; and
   wherein each testing circuit is operable to output a respective output current signal that is a power of two different unique from a current output signal from each other testing circuit in the plurality of testing circuits.

* * * * *